United States Patent
Hayashi et al.

(10) Patent No.: US 9,693,453 B2
(45) Date of Patent: Jun. 27, 2017

(54) WIRING BOARD

(71) Applicant: NGK SPARK PLUG CO., LTD., Nagoya-shi, Aichi (JP)

(72) Inventors: Takahiro Hayashi, Komaki (JP); Seiji Mori, Konan (JP); Tatsuya Ito, Kakamigahara (JP)

(73) Assignee: NGK SPARK PLUS CO., LTD., Nagoya (JP)

( * ) Notice: Subject to any disclaimer, the term of this patent is extended or adjusted under 35 U.S.C. 154(b) by 158 days.

(21) Appl. No.: 14/019,863

(22) Filed: Sep. 6, 2013

(65) Prior Publication Data

US 2014/0069701 A1   Mar. 13, 2014

(30) Foreign Application Priority Data

Sep. 7, 2012   (JP) .................................. 2012-196864

(51) Int. Cl.
*H05K 1/00* (2006.01)
*H05K 1/09* (2006.01)
(Continued)

(52) U.S. Cl.
CPC ............. *H05K 1/092* (2013.01); *H01L 24/13* (2013.01); *H01L 24/16* (2013.01); *H01L 24/32* (2013.01);
(Continued)

(58) Field of Classification Search
CPC ....... H01L 21/563; H01L 24/11; H01L 24/13; H01L 24/16; H01L 24/32; H01L 24/73;
(Continued)

(56) References Cited

U.S. PATENT DOCUMENTS 5,766,674 A * 6/1998 Hirosawa ............. H05K 3/3452
216/13
6,228,466 B1 * 5/2001 Tsukada et al. ............. 428/209
(Continued)

FOREIGN PATENT DOCUMENTS

JP   2007042805 A  *  2/2007  ............. H01L 21/60
JP   2007-103648 A     4/2007
(Continued)

OTHER PUBLICATIONS

Diffusion-Related Behavior of Gold in Thin Film Systems by Pinnel 1979.*

(Continued)

*Primary Examiner* — Timothy Thompson
*Assistant Examiner* — Guillermo Egoavil
(74) *Attorney, Agent, or Firm* — Stites & Harbison, PLLC; Jeffrey A. Haeberlin; James R. Hayne

(57) ABSTRACT

A wiring board includes a base layer, a plurality of connection terminals and a surface layer. The base layer is electrically insulative. The plurality of connection terminals are conductive and formed on the base layer. The surface layer is electrically insulative, and fills gaps between the plurality of connection terminals on the base layer. The connection terminals include a base portion made of a conductive first metal and a coating portion made of a conductive second metal that is different from the first metal. The coating portion penetrates the surface layer, and coats the base portion to the base layer.

2 Claims, 7 Drawing Sheets

(51) Int. Cl.
*H01L 23/00* (2006.01)
*H05K 3/28* (2006.01)
*H05K 3/40* (2006.01)
*H01L 21/56* (2006.01)
*H05K 3/24* (2006.01)

(52) U.S. Cl.
CPC ............... *H01L 24/81* (2013.01); *H05K 3/28* (2013.01); *H05K 3/4007* (2013.01); *H01L 21/563* (2013.01); *H01L 24/73* (2013.01); *H01L 2224/13101* (2013.01); *H01L 2224/16238* (2013.01); *H01L 2224/27013* (2013.01); *H01L 2224/73204* (2013.01); *H01L 2224/81193* (2013.01); *H01L 2224/81411* (2013.01); *H01L 2224/81455* (2013.01); *H01L 2224/92125* (2013.01); *H05K 3/243* (2013.01); *H05K 2201/0769* (2013.01); *H05K 2201/10674* (2013.01); *H05K 2201/10977* (2013.01); *H05K 2203/0597* (2013.01)

(58) Field of Classification Search
CPC ............. H01L 24/81; H01L 2224/1147; H01L 2224/10175; H01L 2224/13099; H01L 2224/13101; H01L 2224/16225; H01L 2224/16227; H01L 2224/16238; H01L 2224/26175; H01L 2224/27013; H01L 2224/32225; H01L 2224/73203; H01L 2224/73204; H01L 2224/81455; H01L 2224/81193; H01L 2224/81411; H01L 2224/92125; H01L 23/49811; H01L 23/49816; H01L 23/49822; H01L 23/49827; H01L 23/49838; H01L 2924/14; H01L 2924/014; H01L 2924/0103; H01L 2924/01006; H01L 2924/01013; H01L 2924/01022; H01L 2924/01029; H01L 2924/01033; H01L 2924/01074; H01L 2924/01079; H01L 2924/01082; H01L 2924/01322; H01L 2924/15151; H01L 23/48; H01L 21/60; H01L 23/12; H01L 23/498; H05K 1/092; H05K 3/28; H05K 3/243; H05K 3/4007; H05K 2201/0769; H05K 2201/10674; H05K 2201/10977; H05K 2203/0597; H05K 1/00; H05K 1/18; H05K 1/11; H05K 3/3452; H05K 3/00; H05K 3/10; H05K 3/34; H05K 3/38; B32B 3/00
USPC ............... 174/250, 255, 257, 258, 260, 261; 361/760; 257/737, 778, E21.503, 257/E21.585, E23.011, E23.01, E23.021, 257/E23.068, 774, 787; 428/209; 438/666
See application file for complete search history.

(56) References Cited

U.S. PATENT DOCUMENTS

| | | | | |
|---|---|---|---|---|
| 2003/0183951 | A1* | 10/2003 | Achari | H01L 21/563 257/787 |
| 2006/0225917 | A1* | 10/2006 | Hu | H05K 1/113 174/257 |
| 2006/0278966 | A1* | 12/2006 | Trezza | H01L 21/6835 257/685 |
| 2007/0108627 | A1* | 5/2007 | Kozaka et al. | 257/778 |
| 2008/0047352 | A1* | 2/2008 | Kurtz | G01L 9/0042 73/753 |
| 2009/0246911 | A1* | 10/2009 | Watanabe | H01L 23/49816 438/108 |
| 2010/0018763 | A1* | 1/2010 | Barry | H05K 3/3452 174/263 |
| 2010/0078208 | A1* | 4/2010 | Inoue | 174/261 |
| 2010/0155116 | A1* | 6/2010 | Kawai | H05K 1/113 174/257 |
| 2010/0155941 | A1* | 6/2010 | Matsuki | H01L 23/3128 257/737 |
| 2011/0316170 | A1* | 12/2011 | Muramatsu | H01L 23/49816 257/774 |

FOREIGN PATENT DOCUMENTS

| | | |
|---|---|---|
| JP | H11-54896 A | 2/2011 |
| JP | 2011-192692 A | 9/2011 |

OTHER PUBLICATIONS

Japanese Patent Office, Office Action issued in corresponding Japanese application No. 2012-196864, mailed Oct. 15, 2013.

* cited by examiner

F2-F2 under US 9,693,453 B2

WIRING BOARD

CROSS REFERENCE TO RELATED APPLICATIONS

The present application claims priority from Japanese Patent Application No. 2012-196864, which was filed on Sep. 7, 2012, the disclosure of which is herein incorporated by reference in its entirety.

BACKGROUND OF THE INVENTION

Field of the Invention

The present invention relates to a wiring board.

Description of Related Art

Wiring boards configured to allow semiconductor chips to be mounted are known (for example, refer to JP-A-2007-103648 and JP-A-2011-192692). On such wiring boards, a plurality of connection terminals configured to be connectable to the semiconductor chips are formed.

JP-A-2007-103648 describes that, in order to prevent electrical short circuit between the connection terminals due to a plating material, an insulating layer having a hole through which the plurality of connection terminals are exposed is formed, an insulating substance is formed between the plurality of connection terminals in the hole, and then the plurality of connection terminals are plated. JP-A-2011-192692 describes that, in order to prevent electrical short circuit between the connection terminals due to soldering, insulating layers formed between the connection terminals are thinned so as to be as thin as or thinner than the connection terminal.

BRIEF SUMMARY OF THE INVENTION

In JP-A-2007-103648 and JP-A-2011-192692, poor insulation caused by migration (metal transfer) occurring between connection terminals is not sufficiently taken into account. The migration occurring between connection terminals refers to a phenomenon in which metal that forms the connection terminals transfers to an insulating layer as time elapses, and becomes a cause of poor insulation between connection terminals. Therefore, for wiring boards, there has been a demand for techniques that can prevent poor insulation caused by the migration. Additionally, for wiring boards, there have been demands for miniaturization, cost reduction, resource saving, ease of manufacturing, improvement of usability, improvement of durability and the like.

The invention has been made to solve at least part of the above problem, and such an object can be achieved using the following aspects.

(1) According to an aspect of the invention, there is provided a wiring board including an electrically insulating base layer; a plurality of conductive connection terminals formed on the base layer; and an electrically insulating surface layer filling gaps between the plurality of connection terminals on the base layer, in which the connection terminals include a base portion made of a conductive first metal and a coating portion which is made of a conductive second metal that is different from the first metal, and that penetrates the electronically insulating surface layer and coats the base portion to the base layer. According to the present aspect of the wiring board, it is possible to suppress migration in which the first metal that forms the base portion transfers to the surface layer using the coating portion made of the second metal. As a result, it is possible to prevent poor insulation caused by migration of the first metal.

(2) In the above aspect of the wiring board, progress of migration of the second metal occurring between the respective connection terminals in the plurality of connection terminals may be slower than that of the first metal. According to the present aspect of the wiring board, it is possible to suppress the progress of the migration occurring between the connection terminals.

(3) In the above aspects of the wiring boards, the first metal may include silver (Ag) or copper (Cu), and the second metal may include nickel (Ni) or tin (Sn). According to the present aspect of the wiring board, it is possible to prevent poor insulation caused by migration of silver and copper.

(4) The invention can also be realized in a variety of aspects other than wiring boards. For example, the invention can be realized in aspects of apparatuses having a wiring board, apparatuses for manufacturing wiring boards, methods for manufacturing wiring boards and the like.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A preferred embodiment of the present invention will next be described with reference to the drawings. However, the embodiment to be described below is a mere example of an application of the technical concept of the present invention. The contents of the embodiment should not be construed as limiting the invention.

Figure 1:
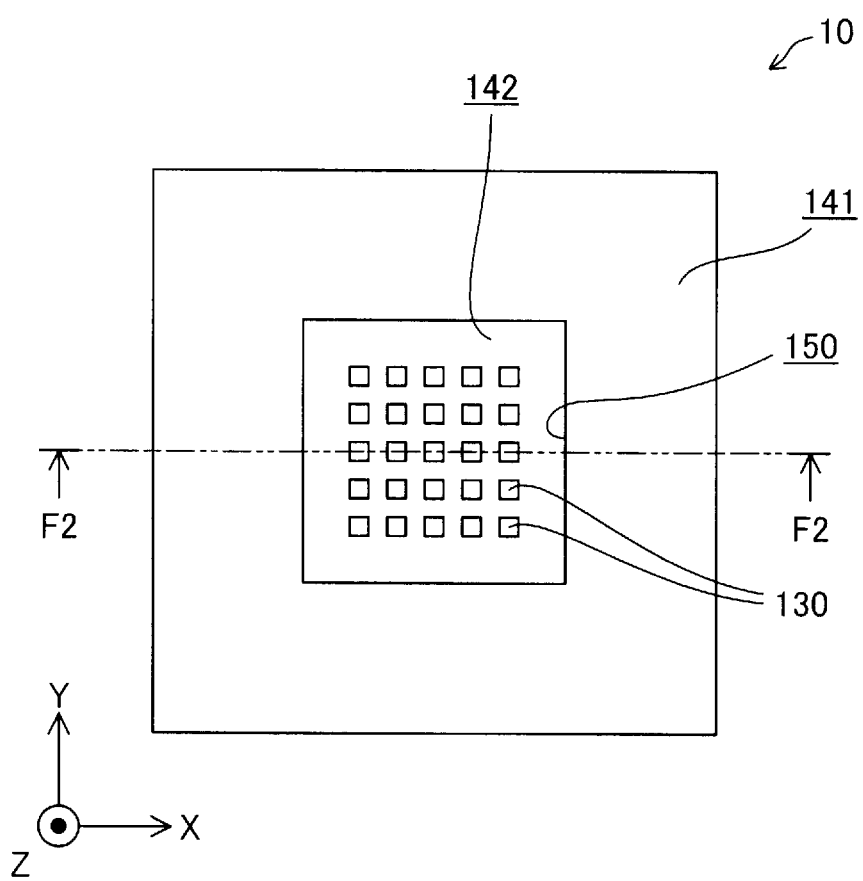
FIG. 1 is a top view illustrating a configuration of a wiring board.
Figure 2:
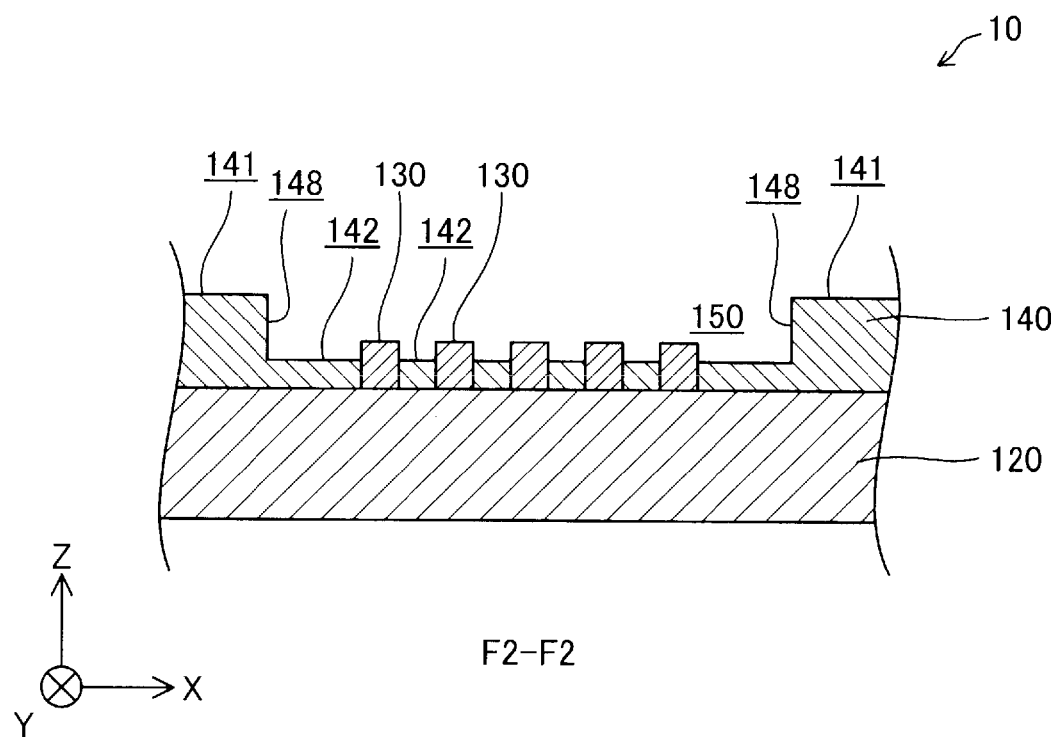
FIG. 2 is a partial cross-sectional view schematically illustrating the configuration of the wiring board.
Figure 3:
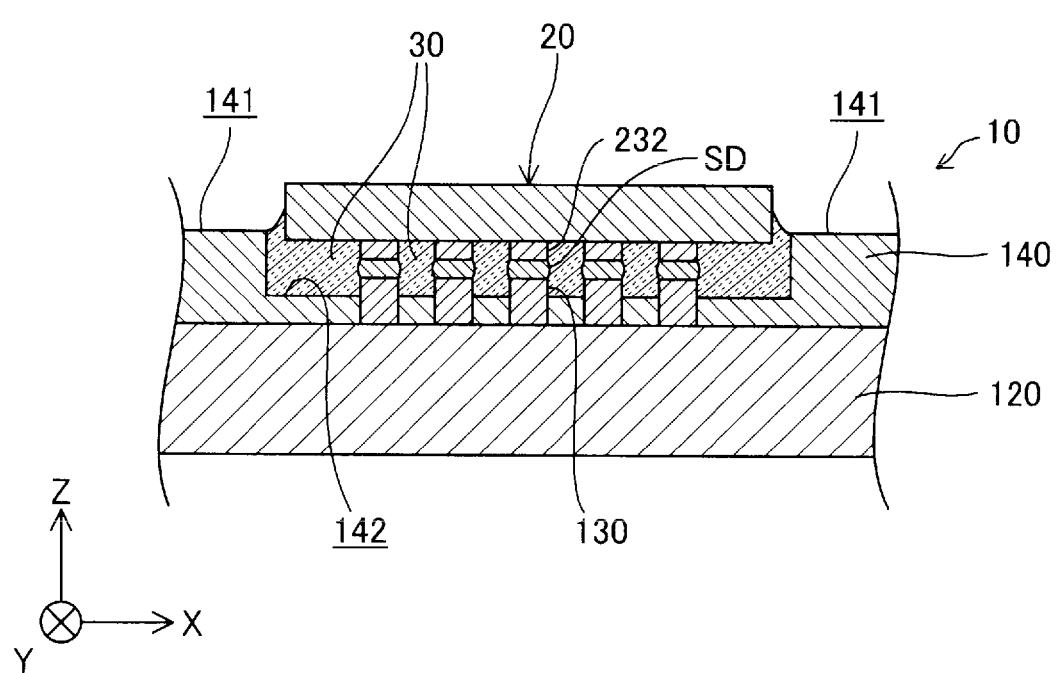
FIG. 3 is a partial cross-sectional view schematically illustrating a configuration of a wiring board on which a semiconductor chip is mounted.

FIG. 1 is a top view illustrating a configuration of a wiring board 10. FIG. 2 is a partial cross-sectional view schematically illustrating the configuration of the wiring board 10. FIG. 3 is a partial cross-sectional view schematically illustrating a configuration of the wiring board 10 on which a semiconductor chip 20 is mounted. FIG. 2 illustrates a cross-section of the wiring board 10 cut along an arrow F2-F2 in FIG. 1. FIG. 3 illustrates a cross-section of the wiring board 10 having the semiconductor chip 20 mounted thereon cut at a position corresponding to the arrow F2-F2 in FIG. 1.

The wiring board 10 is formed using an organic material, and is a plate-shaped member also known as an organic substrate. As illustrated in FIG. 3, in the present embodiment, the wiring board 10 is a flip chip-mounted substrate configured to allow the semiconductor chip 20 to be mounted.

As illustrated in FIGS. 2 and 3, the wiring board 10 includes a base layer 120, connection terminals 130 and a surface layer 140 (e.g., electronically insulating surface layer). In the embodiment, on the base layer 120 of the wiring board 10, the connection terminals 130 are formed, and the surface layer 140 is formed in a state in which the connection terminals 130 are exposed. In other embodiments, the wiring board 10 may have a multi-layer structure in which a plurality of conductive layers and a plurality of insulating layers are alternately laminated on the base layer 120 or may have the above multi-layer structures on both surfaces of the base layer 120 respectively.

FIG. 1 illustrates XYZ axes that mutually intersect at right angles. The XYZ axes in FIG. 1 correspond to XYZ axes in other drawings. Among the XYZ axes in FIG. 1, an axis along a lamination direction of the surface layer 140 with respect to the base layer 120 is considered to be a Z axis. In a Z axis direction along the Z axis, a direction from the base layer 120 toward the surface layer 140 is considered to be a +Z axis direction, and a direction opposite to the +Z axis direction is considered to be a −Z axis direction. Among the XYZ axes in FIG. 1, two axes along a layer surface that intersect the Z axis at a right angle are considered to be an X axis and an Y axis. In an X axis direction along the X axis, a direction from a left side to a right side in FIG. 1 is considered to be a +X axis direction, and a direction opposite to the +X axis direction is considered to be a −X axis direction. In a Y axis direction along the Y axis, a direction from a bottom to a top in FIG. 1 is considered to be a +Y axis direction, and a direction opposite to the +Y axis direction is considered to be a −Y axis direction.

The base layer 120 in the wiring board 10 is a plate-shaped member made of an insulating material. In the embodiment, the insulating material for the base layer 120 is a thermosetting resin, for example, bismaleimide-triazine resin (BT) or an epoxy resin. In other embodiments, the insulating material for the base layer 120 may be a fiber reinforced resin (for example, glass-fiber reinforced epoxy resin). Although not shown in FIGS. 1 to 3, a part of a wire connected to the connection terminals 130 may be configured by forming through holes, through hole conductors and the like in the base layer 120.

The surface layer 140 in the wiring board 10 is a layer made of an insulating material that is also known as solder resist. The surface layer 140 includes a first surface 141, a second surface 142 and wall surfaces 148.

The first surface 141 of the surface layer 140 is a surface of the surface layer 140 in which an opening portion 150 is formed. In the embodiment, the first surface 141 is a surface that extends in the X and Y axes and faces toward the +Z axis direction side, and configures a surface of the surface layer 140 on a +Z axis direction side.

The second surface 142 of the surface layer 140 is a surface of the surface layer 140 which sinks toward the base layer 120 with respect to the first surface 141 in the opening portion 150. In the embodiment, the second surface 142 is a surface that extends in the X and Y axes and faces toward the +Z axis direction side, and configures a surface of the surface layer 140 on a +Z axis direction side in the opening portion 150. As illustrated in FIGS. 1 and 2, the connection terminals 130 are exposed from the second surface 142.

The wall surfaces 148 of the surface layer 140 are surfaces that connect the first surface 141 and the second surface 142 along a lamination direction (Z axis direction), and demarcate the opening portion 150. As illustrated in FIG. 2, in the embodiment, the wall surfaces 148 have an angular shape and connect the first surface 141 and the second surface 142. In other embodiments, the wall surfaces 148 may be connected to at least one of the first surface 141 and the second surface 142 through a curved surface.

The connection terminals 130 of the wiring board 10 forms a conductor pattern made of a conductive material formed on the base layer 120. In the embodiment, the conductor pattern of the connection terminals 130 is formed by etching a copper-plated layer formed on a surface of the base layer 120 into a desired shape.

The connection terminals 130 are exposed from the surface layer 140, and, in the embodiment, exposed from the second surface 142 of the surface layer 140. As illustrated in FIG. 2, in the embodiment, the connection terminals 130 protrude from the second surface 142 in the +Z axis direction.

As illustrated in FIG. 3, the connection terminals 130 are configured to be connectable to connection terminals 232 of the semiconductor chip 20 through solder SD. When the semiconductor chip 20 is mounted on the wiring board 10, the plurality of connection terminals 130 are soldered to the connection terminals 232 of the semiconductor chip 20, and a gap between the wiring board 10 and the semiconductor chip 20 in the opening portion 150 is filled with an underfill material 30.

In the embodiment, the plurality of connection terminals 130 are provided in the wiring board 10. As described in FIG. 1, the plurality of connection terminals 130 are disposed in a matrix shape along the X and Y axes respectively. In the embodiment, a matrix of the plurality of connection terminals 130 is a 5×5 matrix, but the matrix is not limited thereto, and may be any matrix as long as the matrix is an n×m matrix (n and m are natural numbers of 1 or more, a case of n=m=1 is not included). In other embodiments, the plurality of connection terminals 130 may be disposed in a zigzag shape by alternately staggering the adjacent connection terminals 130.

Figure 4:
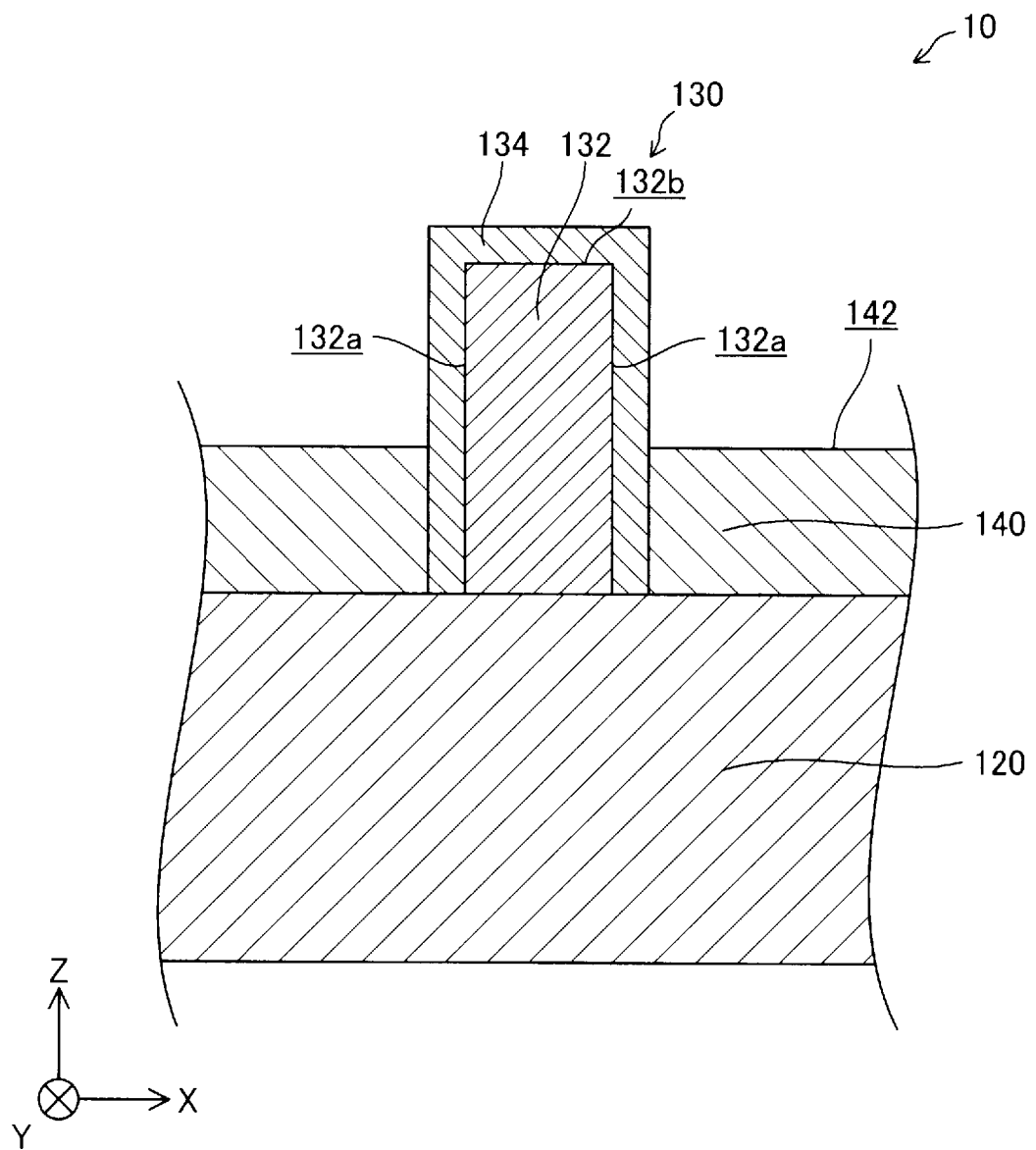
FIG. 4 is an enlarged cross-sectional view schematically illustrating a detailed configuration of a connection terminal in the wiring board.

FIG. 4 is an enlarged cross-sectional view schematically illustrating a detailed configuration of the connection terminal 130 in the wiring board 10. FIG. 4 magnifies one of the connection terminals 130 in FIG. 2. The connection terminal 130 includes a base portion 132 and a coating portion 134.

The base portion 132 of the connection terminal 130 is a member that penetrates the surface layer 140 in a state of being isolated from the surface layer 140 using the coating portion 134, and protrudes from the surface layer 140. In the embodiment, the base portion 132 penetrates the surface layer 140 from the base layer 120 in the +Z axis direction in a state of being isolated from the surface layer 140 using the coating portion 134, and protrudes more than the second surface 142 of the surface layer 140 in the +Z axis direction. The base portion 132 is made of a conductive first metal. In the embodiment, the first metal that forms the base portion 132 is copper (Cu); however, in other embodiments, the first metal may be another conductive material (for example, silver (Ag)).

In the embodiment, the base portion 132 includes side portions 132a and an end portion 132b. The side portions 132a of the base portion 132 configure surfaces of the base portion 132 which face the surface layer 140, and are connected to the end portion 132b. The end portion 132b of the base portion 132 configures an end of the base portion 132 on the +Z axis direction side. The side portions 132a and the end portion 132b are coated with the coating portion 134.

The coating portion 134 of the connection terminal 130 is a portion that penetrates the surface layer 140 and coats the base portion 132 to the base layer 120. In the embodiment, the coating portion 134 coats the side portions 132a and the end portion 132b of the base portion 132. In the embodiment, the coating portion 134 is made of the conductive second metal. In the embodiment, progress of migration of the second metal that forms the coating portion 134 which occurs in the surface layer 140 between the connection terminals 130 is slower than that of the first metal. In the embodiment, the second metal that forms the coating portion 134 is nickel (Ni); however, in other embodiments, the second metal may be another conductive material (for example, tin (Sn)).

Figure 5:
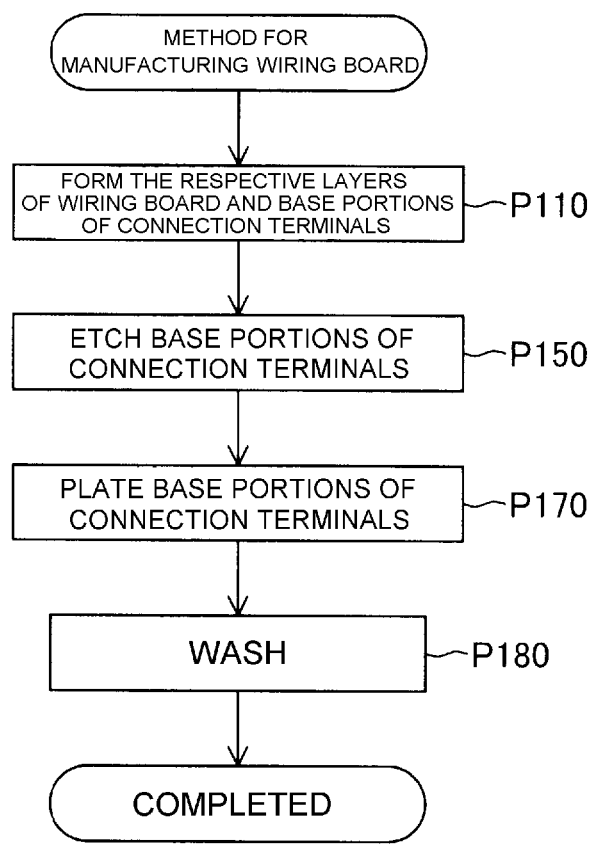
FIG. 5 is a process drawing illustrating a method for manufacturing the wiring board.

FIG. 5 is a process drawing illustrating a method for manufacturing the wiring board 10. When the wiring board 10 is manufactured, the respective layers of the wiring board 10, such as the base layer 120 and the surface layer 140, are formed, and the base portions 132 of the connection terminals 130 are formed (Process P110). In the embodiment, after a copper-plated layer is formed on the surface of the base layer 120, the copper-plated layer is etched into a desired shape, thereby forming the base portions 132 of the connection terminals 130.

In the embodiment, after a photocurable insulating resin is coated on the base layer 120 on which the base portions 132 of the connection terminals 130 are formed, the resin is exposed and developed, thereby forming the surface layer 140. The opening portion 150 of the surface layer 140 corresponds to a portion masked during exposure, and portions uncured during development are washed away, thereby forming the second surface 142 and the wall surfaces 148 of the surface layer 140. As such, in the embodiment, the first surface 141, the second surface 142 and the wall surfaces 148 of the surface layer 140 are integrally formed as a portion that configures a single layer. In other embodiments, the second surface 142 of the surface layer 140 may be formed by temporarily forming the opening portion 150 of the surface layer 140 to the base portion 132, and then, again, filling the opening portion 150 with the photocurable insulating resin.

Figure 6:
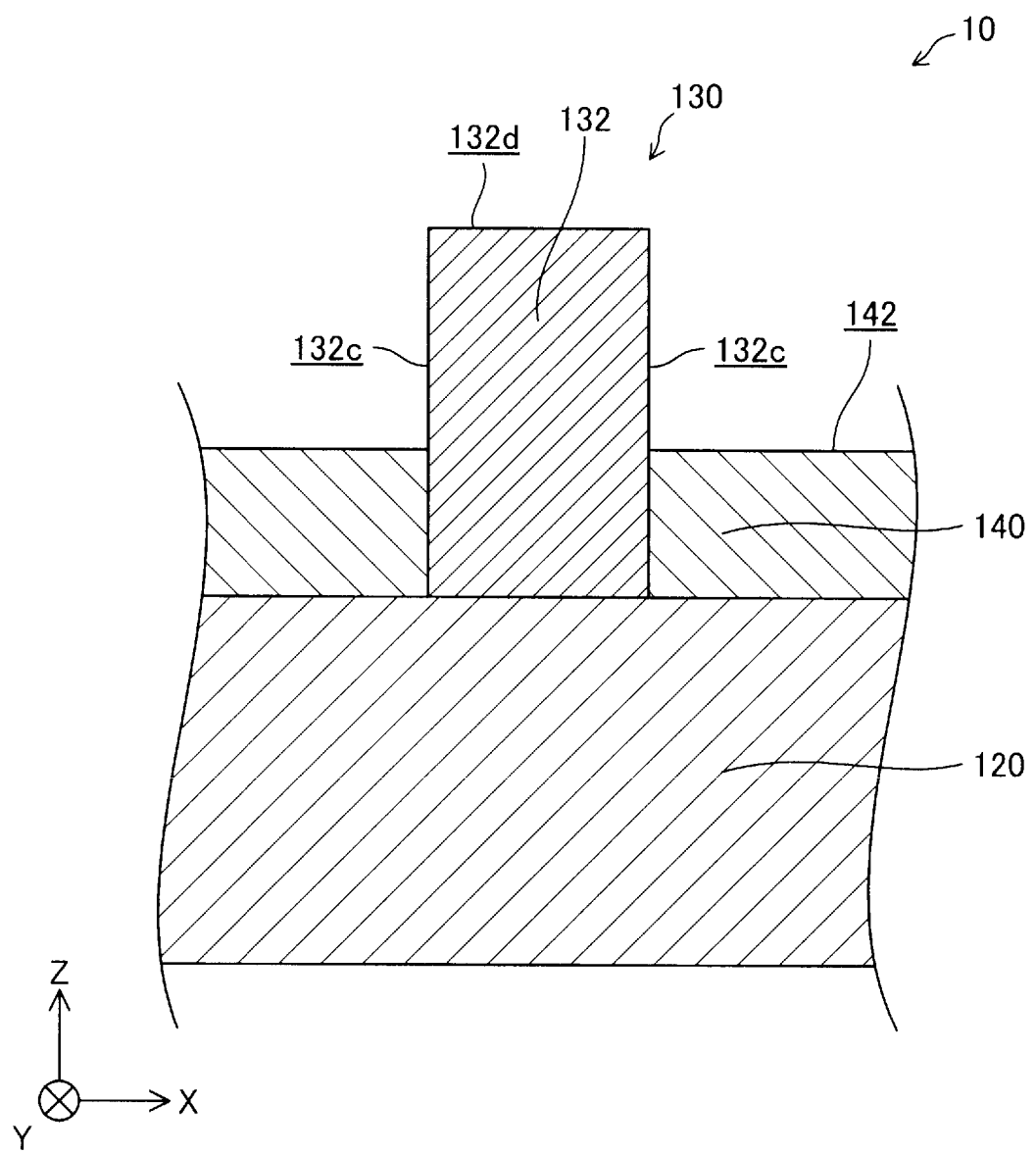
FIG. 6 is an enlarged cross-sectional view schematically illustrating the detailed configuration of the connection terminal in the wiring board being manufactured.

FIG. 6 is an enlarged cross-sectional view schematically illustrating the detailed configuration of the connection terminal 130 in the wiring board 10 being manufactured. FIG. 6 illustrates the wiring board 10 when Process P110 has ended.

When Process P110 has ended, the base portions 132 of the connection terminals 130 come close to the surface layer 140, penetrate the surface layer 140, and are exposed from the surface layer 140 in a state of being protruded. When Process P110 has ended, the base portion 132 of the connection terminal 130 has the side portions 132c and the end portion 132d. The side portions 132c of the base portion 132 configure the surfaces of the base portion 132 which face the surface layer 140. Parts of the side portions 132c below the second surface 142 in the −Z axis direction come close to an inside of the surface layer 140. Part of the side portions 132c above the second surface 142 in the +Z axis direction is in a state of being exposed from the surface layer 140, and connected to the end portion 132b. The end portion 132d of the base portion 132 configures the end of the base portion 132 on the +Z axis direction side, and is in a state of being exposed from the surface layer 140.

Returning to the description of FIG. 5, after Process P110 has ended, the side portions 132c and the end portion 132d of the base portion 132 are shrunk by etching the base portion 132 of the connection terminal 130 (Process P150). In the embodiment, in Process P150, an etchant containing sodium persulfate is used for copper (Cu) that forms the base portion 132. In other embodiments, the etchant used in Process P150 may be an etchant containing components of a sulfuric acid/hydrogen peroxide mixture, iron chloride, copper chloride and the like.

Figure 7:
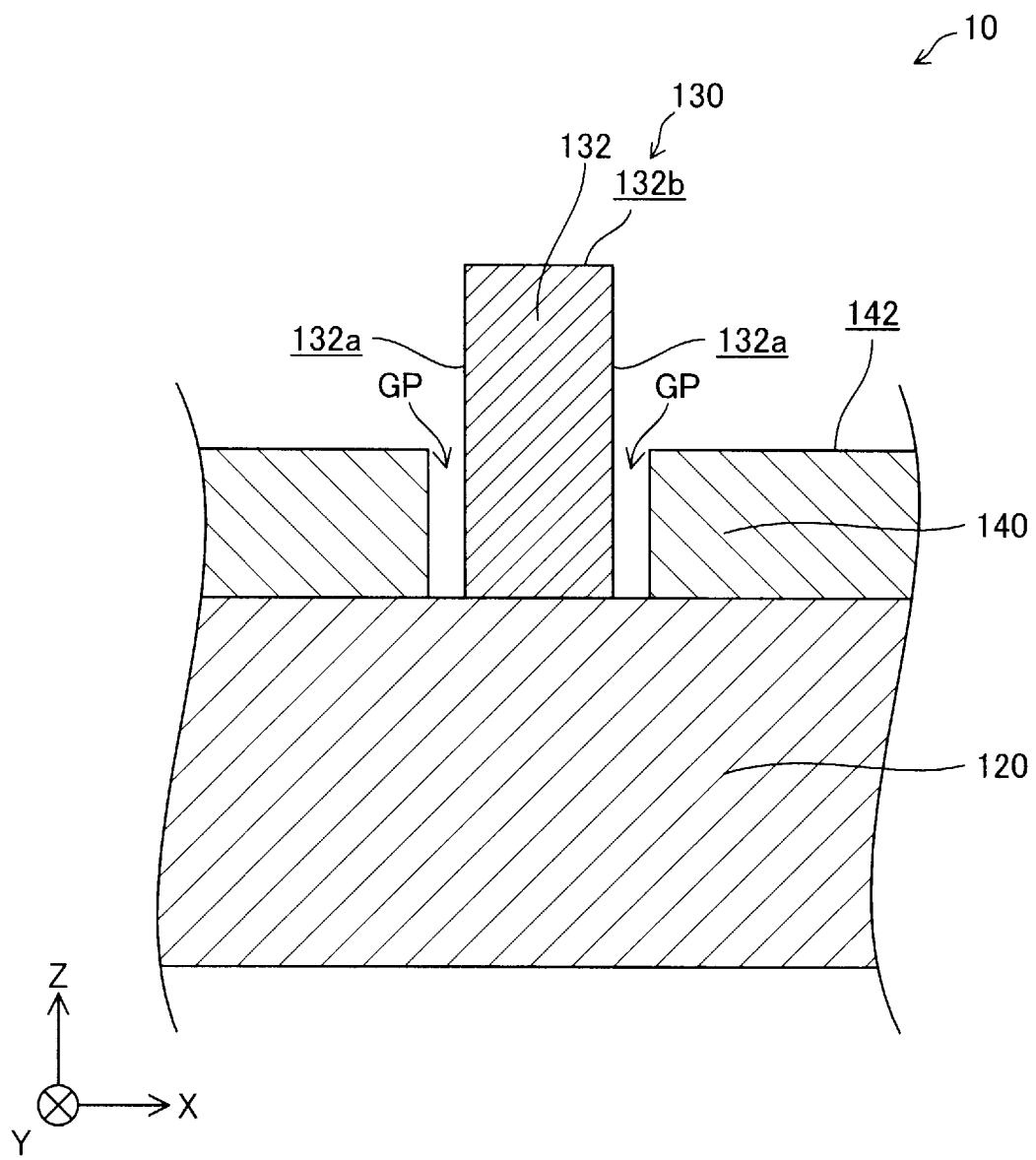
FIG. 7 is an enlarged cross-sectional view schematically illustrating the detailed configuration of the connection terminal in the wiring board being manufactured.

FIG. 7 is an enlarged cross-sectional view schematically illustrating the detailed configuration of the connection terminal 130 in the wiring board 10 being manufactured. FIG. 7 illustrates the wiring board 10 when Process P150 has ended.

In Process P150, the base portions 132 are shrunk through etching, and, in the base portions 132, the side portions 132a and the end portion 132b are formed instead of the side portions 132c and the end portion 132d. Accordingly, a gap GP extending from the surface layer 140 to the base layer 120 is formed between the base portion 132 and the surface layer 140. The gap GP is preferably formed around the whole circumference of the base portion 132.

Returning to the description of FIG. 5, after Process P150 has ended, the coating portions 134 of the connection terminals 130 are formed through a plating treatment using non-electrolytic plating (Process P170). In the embodiment, in Process P170, the coating portions 134 are formed on the side portions 132a and the end portion 132b of the base portion 132 using nickel plating. Thereby, the gaps GP between the base portions 132 and the surface layers 140 are filled with the coating portions 134, and the connection terminals 130 are configured as illustrated in FIG. 4. In other embodiments, the coating portions 134 may be formed of other conductive materials (for example, tin (Sn)).

After Process P170 has ended, the wiring board 10 is washed (Process P180). Thereby, the wiring board 10 is completed.

According to the embodiment described above, it is possible to suppress the migration in which the first metal that forms the base portions 132 of the connection terminals 130 transfers to the surface layer 140 using the coating portions 134 of the connection terminals 130 made of the second metal. As a result, it is possible to prevent poor insulation caused by the migration of the first metal. In addition, since the progress of the migration of the second metal occurring between the connection terminals 130 is slower than that of the first metal, it is possible to suppress progress of the migration occurring between the connection terminals 130.

Figure 8:
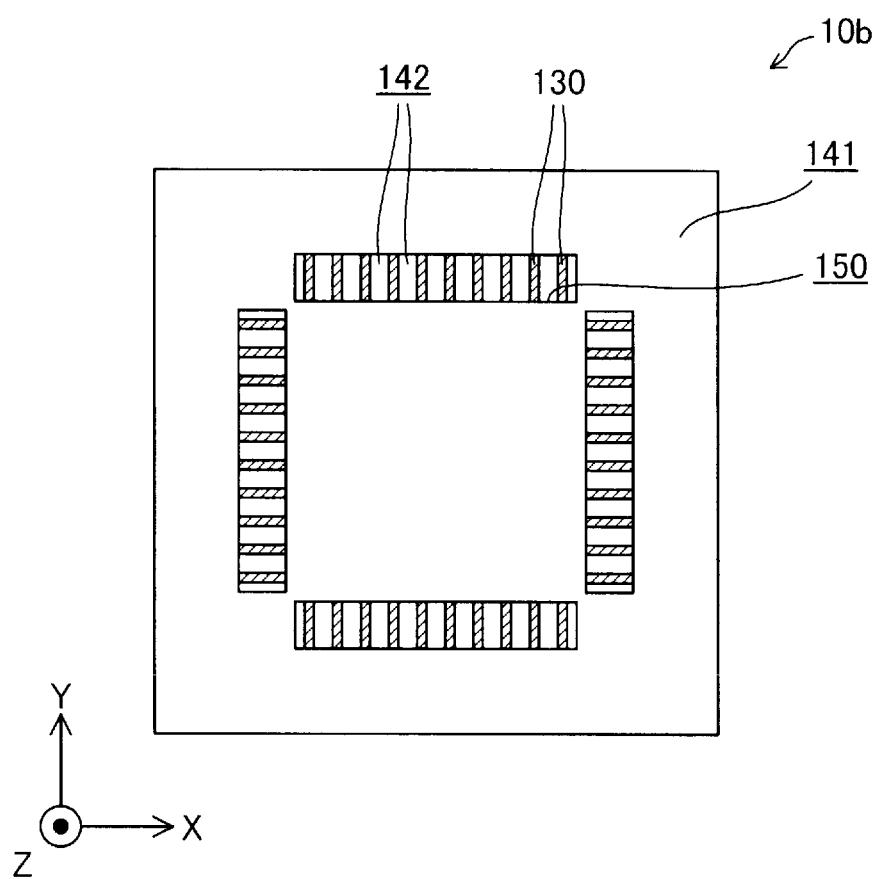
FIG. 8 is a top view illustrating a configuration of a wiring board in a modified example.

FIG. 8 is a top view illustrating a configuration of a wiring board 10b in a modified example. In a description of a wiring board 10b, the same embodiments as in the wiring board 10 of the first embodiment will be given the same reference number, and will not be described. The present modified example can be applied to other embodiments and other modified examples described in the present specification. The wiring board 10b of the modified example are the same as the wiring board 10 of the first embodiment except that the first surface 141, the second surface 142, the connection terminals 130 and the opening portion 150 respectively have different shapes from those in the first embodiment.

On the first surface 141 of the wiring board 10b, four opening portions 150 are formed. Each of the four opening portions 150 forms a rectangular shape seen from the +Z axis direction, and is disposed so as to surround a square in the center. In the modified example, each of the four opening portions 150 is disposed along an external edge of the wiring board 10*b*.

In FIG. 8, hatching is drawn in the connection terminals 130. A plurality of the second surfaces 142 and a plurality of the connection terminals 130 are formed in the opening portions 150 in the modified example. Each of the plurality of the connection terminals 130 forms a stripe shape from one end of the opening portion 150 toward the other end in a short side direction of the opening portion 150 that forms a rectangular shape, and the second surfaces 142 are formed between the connection terminals 130. Similarly to the first embodiment, the connection terminal 130 of the modified example includes the base portion 132 and the coating portion 134.

According to the modified example described above, similarly to the first embodiment, it is possible to suppress the progress of the migration occurring between the connection terminals 130.

The invention is not limited to the embodiment, examples and modified example described above, and can be realized using a variety of configurations within the scope of the purport of the invention. For example, technical characteristics of the embodiment, examples and modified example corresponding to technical characteristics of the respective aspects described in the summary of the invention can be appropriately replaced or combined in order to solve part or all of the above problems or obtain part or all of the above effects. In addition, technical characteristics that are described in the specification as unessential factors can be appropriately removed.

What is claimed is:

1. A wiring board, comprising:
an electrically insulating base layer;
a plurality of conductive connection terminals formed on the base layer; and
an electrically insulating surface layer filling gaps between the plurality of connection terminals on the base layer, the electrically insulating surface layer formed in a state in which the connection terminals are exposed therefrom with an upper surface of the electrically insulating surface layer lower than a top surface of the plurality of conductive connection terminals,
wherein the connection terminals include:
a base portion made of a conductive first metal that includes copper, and
a coating portion made of a conductive second metal that is different from the first metal, and that penetrates the electrically insulating surface layer and coats the base portion to the base layer;
wherein the base portion is a copper-plated layer; and
wherein progress of migration of the second metal occurring between the respective connection terminals in the plurality of connection terminals is slower than migration of the first metal.

2. The wiring board according to claim 1, wherein:
the second metal includes nickel (Ni) or tin (Sn).

* * * * *